United States Patent
Yamasaki

(10) Patent No.: US 8,730,753 B2
(45) Date of Patent: May 20, 2014

(54) NONVOLATILE SEMICONDUCTOR MEMORY DEVICE

(71) Applicant: Seiko Instruments Inc., Chiba (JP)

(72) Inventor: Taro Yamasaki, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/777,468

(22) Filed: Feb. 26, 2013

(65) Prior Publication Data
US 2013/0229881 A1    Sep. 5, 2013

(30) Foreign Application Priority Data
Mar. 5, 2012  (JP) ................................. 2012-048190

(51) Int. Cl.
*G11C 5/14*   (2006.01)
(52) U.S. Cl.
USPC ... 365/228; 365/226; 365/233.1; 365/233.12; 365/189.09
(58) Field of Classification Search
USPC ............ 365/228, 226, 233.1, 233.12, 189.09
See application file for complete search history.

(56) References Cited

U.S. PATENT DOCUMENTS

| | | | | |
|---|---|---|---|---|
| 5,689,460 | A * | 11/1997 | Ooishi | 365/189.07 |
| 7,515,488 | B2 * | 4/2009 | Thorp et al. | 365/189.09 |
| 7,558,129 | B2 * | 7/2009 | Thorp et al. | 365/189.09 |
| 7,948,301 | B2 * | 5/2011 | Cook et al. | 327/536 |
| 7,948,720 | B2 * | 5/2011 | Mok et al. | 361/18 |
| 7,965,130 | B1 * | 6/2011 | Cook et al. | 327/536 |
| 8,008,964 | B1 * | 8/2011 | Cook et al. | 327/536 |
| 8,040,700 | B2 * | 10/2011 | Cook et al. | 363/59 |
| 8,094,505 | B2 * | 1/2012 | Khellah et al. | 365/189.09 |
| 2010/0308661 | A1 * | 12/2010 | Garcia et al. | 307/80 |
| 2013/0124888 | A1 * | 5/2013 | Tanaka et al. | 713/320 |

FOREIGN PATENT DOCUMENTS

JP  2005-117773 A  4/2005

* cited by examiner

*Primary Examiner* — Viet Q Nguyen
(74) *Attorney, Agent, or Firm* — Brinks Gilson & Lione

(57) ABSTRACT

A nonvolatile semiconductor memory device, having a booster circuit capable of performing a boost operation with appropriate boost voltage arrival time without increasing the circuit size. The nonvolatile semiconductor memory device includes a timing generator circuit and a current load circuit which applies a current load to an output of a booster unit according to a signal from the timing generator circuit, thereby achieving an appropriate boost voltage arrival time by using the current load circuit in concert with the operation of erasing or writing on memory cells.

4 Claims, 4 Drawing Sheets

NONVOLATILE SEMICONDUCTOR MEMORY DEVICE

RELATED APPLICATIONS

This application claims priority under 35 U.S.C. §119 to Japanese Patent Application No. 2012-048190 filed on Mar. 5, 2012, the entire content of which is hereby incorporated by reference.

BACKGROUND OF THE INVENTION

1. Field of the Invention

The present invention relates to an electrically-rewritable nonvolatile semiconductor memory device, and more specifically to a booster circuit thereof.

2. Background Art

In a nonvolatile semiconductor memory device capable of electrically erasing, writing, and reading data, it is required to apply a high voltage equal to or higher than a supply voltage to a selected memory cell in an erase and write operation and therefore a boost voltage which is a desired high voltage is generated using a booster circuit including a booster unit and a control system thereof.

In general, a driving force of the booster circuit depends on the amplitude of boosting clock pulses. Moreover, the erase and write operation on the nonvolatile memory is sometimes performed by selecting different numbers of memory cells such as, for example, memory cells in units of a word, a page composed of a plurality of words, or a sector or in a lump of all regions, and the like. Therefore, a load capacity depends on the number of selected memory cells.

A boost voltage arrival time depends on a correlation between the driving force of the booster circuit and the load capacity. The greater the driving force of the booster circuit is, the shorter the boost voltage arrival time is. The larger the load capacity is, the longer the boost voltage arrival time is. Specifically, the boost voltage arrival time varies according to the amplitude of boosting clock pulses or the number of selected memory cells. If the boost voltage arrival time is too short, it causes an increase in the time for which an intense electric field is applied, which accelerates the reliability degradation of the memory cells. Contrary to this, if the boost voltage arrival time is too long, it causes a decrease in the time for which the electric field strength required for rewriting is applied to the memory cells, which leads to insufficient rewriting.

To solve this problem, there is proposed a technique described below (for example, see Patent Document 1). In Patent Document 1, the boost voltage arrival time is monitored in real time and compared with the time previously recorded in a ROM. Then, if the boost voltage arrival time is short, the amplitude of the clock pulses is decreased to reduce the capability of boosting of the booster circuit for adjustment to correct the short boost voltage arrival time. If the boost voltage arrival time is long, the amplitude of the clock pulses is increased to enhance the capability of boosting of the booster circuit for adjustment to correct the long boost voltage arrival time. Thereby, appropriate boost voltage arrival time is achieved by adjusting the driving force of the booster circuit so that the driving force of the booster circuit is appropriate for the load capacity.

[Patent Document 1] Japanese Patent Application Laid-Open No. 2005-117773

SUMMARY OF THE INVENTION

The conventional technique, however, requires a comparator for monitoring a boost voltage, a ROM and a comparator for comparing a boost voltage arrival time, a regulator for controlling the amplitude of clock pulses and the like, which leads to an increase in the circuit size, thereby increasing the area of the entire booster circuit.

The present invention has been provided to solve the above problem. Therefore, according to an aspect of the present invention, there is provided a nonvolatile semiconductor memory device, including: a booster unit; an oscillator circuit; a timing generator circuit; a control clock generator circuit; and a current load circuit, wherein: the timing generator circuit has an input terminal, which is connected to an output terminal of the control clock generator circuit, and an output terminal, which is connected to a first input terminal of the booster unit, to an input terminal of the oscillator circuit, and to an input terminal of the current load circuit; the booster unit has a second input terminal, which is connected to an output terminal of the oscillator circuit, and an output terminal, which is connected to an output terminal of the current load circuit; and the current load circuit applies or removes a current load to or from the output terminal of the booster unit at a timing generated by the timing generator circuit.

According to the booster circuit of the present invention, the current load circuit applies the current load for a certain period of time from the output of the booster unit to control the driving force of the booster circuit, thereby enabling a boost operation with appropriate boost voltage arrival time.

Moreover, a regulator and the like are not used, but a control clock generator circuit and a timing generator circuit, which are used in a general nonvolatile semiconductor memory device, are used, thereby enabling a boost operation with appropriate boost voltage arrival time without increasing the circuit area of the entire booster circuit.

DETAILED DESCRIPTION OF THE PREFERRED EMBODIMENTS

First Embodiment

Figure 1:
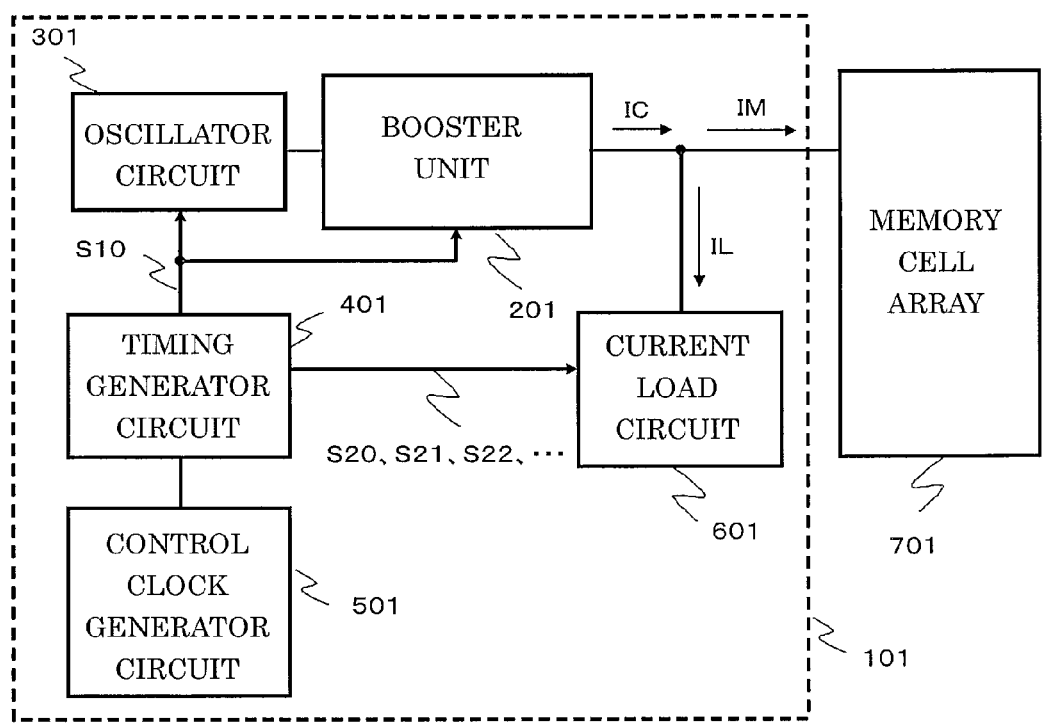
FIG. 1 is a block diagram of a nonvolatile semiconductor memory device having a booster circuit according to a first embodiment.

Referring to FIG. 1, there is illustrated a block diagram of a nonvolatile semiconductor memory device having a booster circuit according to a first embodiment.

The nonvolatile semiconductor memory device having the booster circuit according to the first embodiment includes a booster circuit 101 and a memory cell array 701. The booster circuit 101 includes a booster unit 201, an oscillator circuit 301, a timing generator circuit 401, a control clock generator circuit 501, and a current load circuit 601.

The oscillator circuit 301 generates boosting clock pulses. The booster unit 201 generates a boost voltage according to the input boosting clock pulses and supplies the memory cell array 701 with the boost voltage. The timing generator circuit 401 frequency-divides clock pulses output from the control clock generator circuit 501 by a predetermined number of times and supplies the booster unit 201, the oscillator circuit 301, and the current load circuit 601 with timing signals required for the respective circuits. The current load circuit 601 controls the driving force of the booster circuit 101 by controlling the output of the booster unit 201 with a current load IL according to the timing signal from the timing generator circuit 401.

Figure 2:
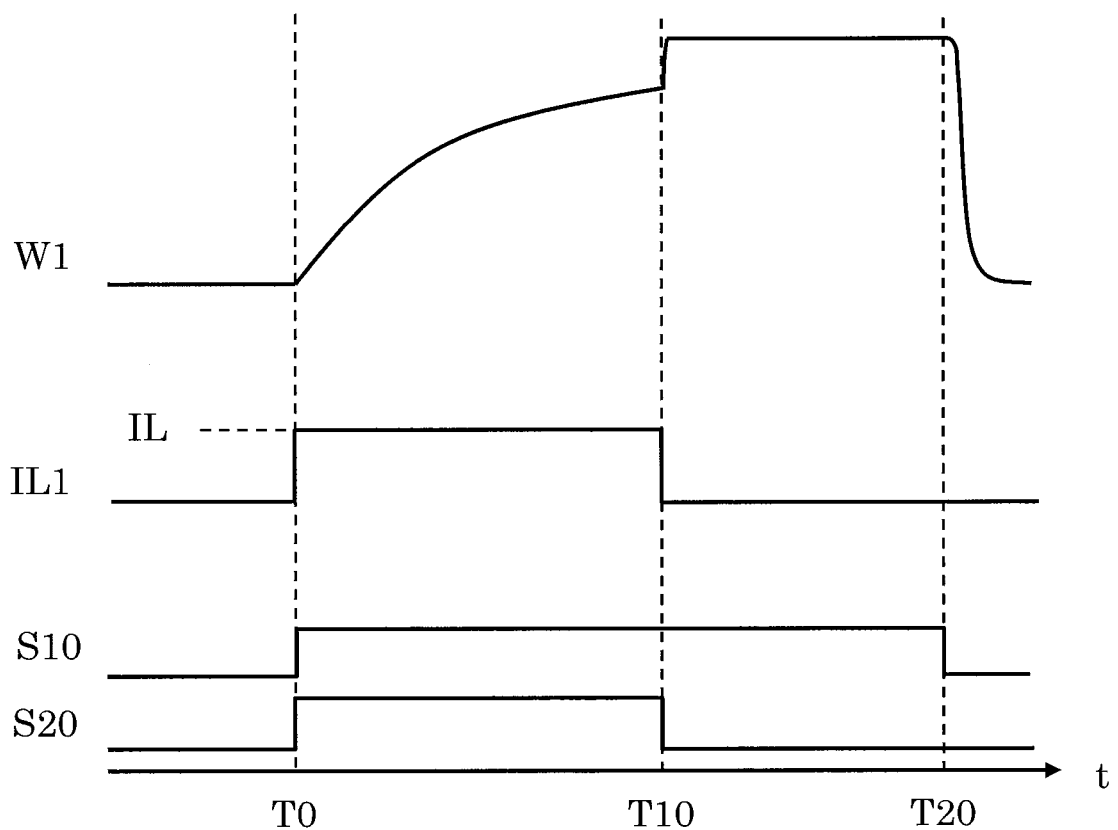
FIG. 2 is a timing diagram for describing the operation of the booster circuit according to the first embodiment.

FIG. 2 is a timing diagram for describing the operation of the booster circuit according to the first embodiment.

W1 represents a boost voltage waveform for erasing and writing on a memory cell which is supplied from the booster circuit 101 to the memory cell array 701. IL1 represents a waveform of a current value at each timing of the current load circuit 601. S10 represents a timing signal input from the timing generator circuit 401 to the oscillator circuit 301 and to the booster unit 201. S20 represents a timing signal input from the timing generator circuit 401 to the current load circuit 601. T0, T10, and T20 represent timings generated by the timing generator circuit 401.

Subsequently, the operation of the booster circuit 101 will be described by using the timing diagram of FIG. 2.

The timing generator circuit 401 raises the timing signal S10 and the timing signal S20 at the timing T0. The boosting oscillator 301 and the booster circuit 201 start up in response to the rise of the timing signal S10 to start the boost operation. The current load circuit 601 draws the load current IL from the output terminal of the booster unit 201 in response to the rise of the timing signal S20 to limit the driving force of the booster circuit 101. Therefore, the boost voltage waveform W1 gradually rises to reach a desired voltage.

The timing generator circuit 401 drops the timing signal S20 at the timing T10. The load current circuit 601 stops in response to the fall of the timing signal S20 and stops the limitation of the driving force of the booster circuit 101. Therefore, the boost voltage waveform W1 rises to a desired voltage. Here, the period from the timing T10 to the timing T20 is a period for erasing and writing on the memory cell.

The timing generator circuit 401 drops the timing signal S10 at the timing T20. The booster unit 201 and the oscillator circuit 301 stop in response to the fall of the timing signal S10 and terminate the boost operation.

The driving force of the booster unit 201 is the amount of supplied charge per unit time, i.e., a current value. Therefore, the driving force of the booster unit 201 is referred to as a current value IC. Moreover, the current value of the electric current with which the booster circuit 101 is able to supply the memory cell array is referred to as IM.

During the period from the timing T0 to the timing T10, the current load circuit 601 is operating and therefore the current value IM is as obtained by expression IM=IC−IL. Accordingly, the time constant of the rise of the output from the booster circuit 101 is IC/(IC−IL) times greater than the time constant when the control is not performed. Thereby, a certain or longer boost voltage arrival time is achieved, thereby successfully suppressing the reliability degradation of the memory cells.

Moreover, during the period from the timing T10 to the timing T20, the current load circuit 601 remains at rest and therefore the current value IM is as obtained by expression IM=IC. Accordingly, in the erasing and writing period, it is possible to supply the memory cells with voltage sufficient for the erase and write operation.

As described hereinabove, according to the booster circuit of this embodiment, the load current circuit 601 controls the driving force of the booster circuit 101 and thus there is no need to add a comparator, a regulator, a ROM, or the like anew. Therefore, it is possible to prevent an increase in the circuit area of the entire booster circuit.

Figure 3:
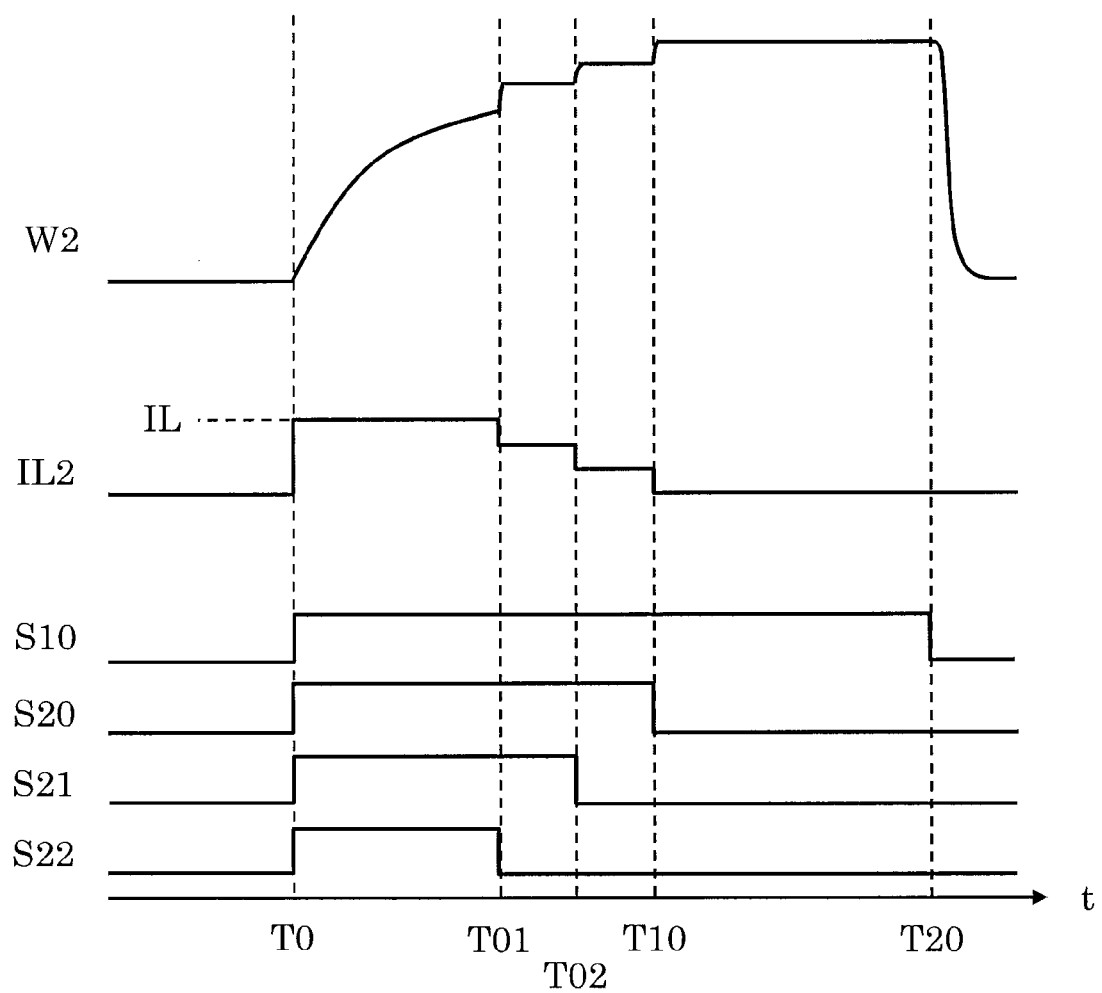
FIG. 3 is a timing diagram for describing another illustrative operation of the booster circuit according to the first embodiment.

FIG. 3 is a timing diagram for describing another illustrative operation of the booster circuit according to the first embodiment. The booster circuit of the first embodiment is also able to increase the boost voltage in a stepwise fashion as illustrated in FIG. 3.

W2 represents a boost voltage waveform for erasing and writing on a memory cell which is supplied from the booster circuit 101 to the memory cell array 701. IL2 represents a waveform of a current value at each timing of the current load circuit 601. S10 represents a timing signal input from the timing generator circuit 401 to the oscillator circuit 301 and to the booster unit 201. S20, S21, and S22 represent timing signals input from the timing generator circuit 401 to the current load circuit 601. T0, T01, T02, T10, and T20 represent timings generated by the timing generator circuit 401.

Subsequently, the operation of the booster circuit 101 will be described by using the timing diagram of FIG. 3.

The timing generator circuit 401 raises the timing signal S10 and the timing signal S20 at the timing T0. The boosting oscillator 301 and the booster circuit 201 start up in response to the rise of the timing signal S10 to start the boost operation. The current load circuit 601 draws the load current IL from the output terminal of the booster unit 201 in response to the rise of the timing signals S20, S21, and S22 to limit the driving force of the booster circuit 101. The load current circuit 601 decreases the current value in response to the fall of the timing signal S22 at the timing T01. Furthermore, the load current circuit 601 decreases the current value in response to the fall of the timing signal S21 at the timing T02.

In this manner, the boost voltage W2 is controlled in a stepwise fashion by decreasing the load current value of the current load circuit 601 from the load current IL in a stepwise fashion in the order of the timing T01 and the timing T02. Thereby, it is possible to suppress the steep rise of the boost voltage, which occurs when the current load is completely removed at the timing T10, so as to be moderate, thereby achieving a higher effect with respect to the suppression of the reliability degradation of the memory cells.

Moreover, the number of steps in which the load current value of the current load circuit 601 is decreased in a stepwise fashion during the period from the timing T0 to the timing T10 is not limited to two as illustrated in FIG. 3, but may be set to an appropriate number of times.

Second Embodiment

Figure 4:
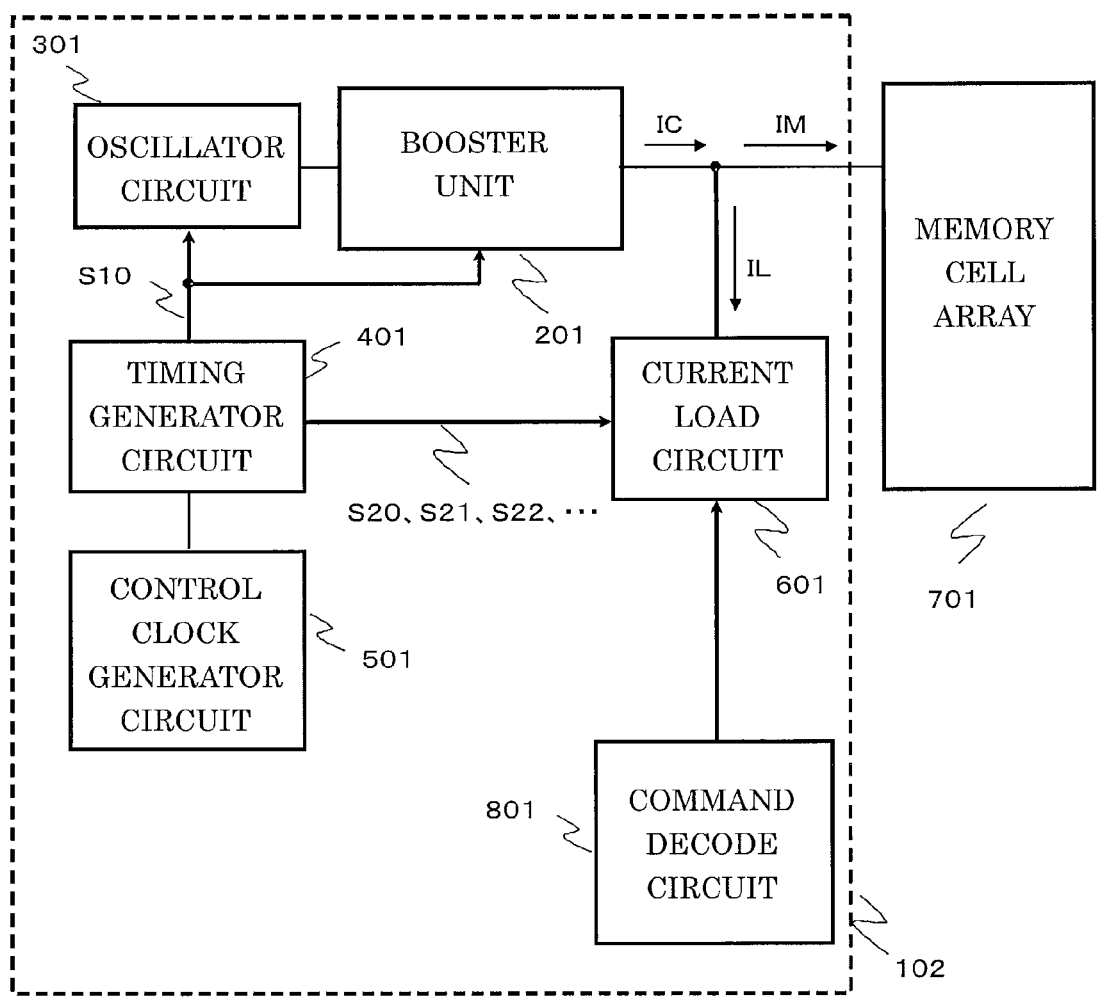
FIG. 4 is a block diagram of a nonvolatile semiconductor memory device having a booster circuit according to a second embodiment.

FIG. 4 is a block diagram of a nonvolatile semiconductor memory device having a booster circuit according to a second embodiment.

The booster circuit 102 according to the second embodiment has a configuration in which a command decode circuit 801 is added to the booster circuit 101 of the first embodiment. The command decode circuit 801 inputs a signal to the current load circuit 601.

The command decode circuit 801 is a circuit which converts a command, which is input from an interface, to a signal to be sent to each circuit. The command decode circuit 801 converts a rewrite unit, which is input from the interface, and the command decode circuit 801 outputs a signal for varying the current load value in each write unit to the current load circuit 601.

For example, if the write unit is a word, the load current of the current load circuit 601 is connected to the output of the booster circuit 201 and the control described in the first embodiment is performed. If the write or erase unit on memory cells is a lump of all regions, the load current of the current load circuit 601 is disconnected from the output of the booster unit 201 or the load current is decreased for control, thereby enabling the suppression of variation in the boost voltage arrival time which is caused by different load capacities.

Moreover, the current regulation of the current load circuit 601 is able to be performed by using a switch or by a change in the current mirror ratio. Therefore, a regulator is unnecessary, thereby enabling the suppression of an increase in the circuit size of the entire booster circuit.

What is claimed is:

1. A nonvolatile semiconductor memory device having a booster circuit, the booster circuit comprising a booster unit, an oscillator circuit, a timing generator circuit, a control clock generator circuit, and a current load circuit;

the timing generator circuit has an input terminal, which is connected to an output terminal of the control clock generator circuit, and an output terminal, which is connected to a first input terminal of the booster unit, to an input terminal of the oscillator circuit, and to an input terminal of the current load circuit;

the booster unit has a second input terminal, which is connected to an output terminal of the oscillator circuit, and an output terminal, which is connected to an output terminal of the current load circuit; and the current load circuit applies or removes a current load to or from the output terminal of the booster unit at a timing generated by the timing generator circuit.

2. The nonvolatile semiconductor memory device according to claim 1, wherein the current load circuit stops the operation in erasing or writing on a memory cell.

3. The nonvolatile semiconductor memory device according to claim 2, wherein the current load circuit has a current load which decreases in a stepwise fashion before starting the operation of erasing or writing on the memory cell.

4. The nonvolatile semiconductor memory device according to any one of claim 1, wherein the current load circuit has a current load applied to the output terminal of the booster unit which is increased or decreased according to a signal from a command decode circuit.

* * * * *